(12) United States Patent
Deaconu

(10) Patent No.: US 7,579,578 B2
(45) Date of Patent: Aug. 25, 2009

(54) ADVANCED MULTIPURPOSE PSEUDOSPARK SWITCH HAVING A HOLLOW CATHODE WITH A PLANAR SPIRAL ELECTRODE AND AN APERTURE

(75) Inventor: Stelu Deaconu, Madison, AL (US)

(73) Assignee: CFD Research Corporation, Hunstville, AL (US)

( * ) Notice: Subject to any disclaimer, the term of this patent is extended or adjusted under 35 U.S.C. 154(b) by 399 days.

(21) Appl. No.: 11/692,982

(22) Filed: Mar. 29, 2007

(65) Prior Publication Data

US 2008/0238325 A1    Oct. 2, 2008

(51) Int. Cl.
*H01J 40/14* (2006.01)

(52) U.S. Cl. .................. 250/214 LS; 250/239

(58) Field of Classification Search ............ 250/214.1, 250/239, 214 LS, 214 R, 214 VT; 378/119; 361/542, 572, 120, 130; 315/326, 335, 111.8, 315/118.21; 313/231.31, 231.21, 231.91, 313/231.11, 581–603
See application file for complete search history.

(56) References Cited

U.S. PATENT DOCUMENTS 6,104,022 A * 8/2000 Young et al. ............. 250/214.1

* cited by examiner

*Primary Examiner*—Que T Le
(74) *Attorney, Agent, or Firm*—Tomas Friend, LLC

(57) ABSTRACT

The present invention provides a pseudospark switch that overcomes the aforementioned limitations of existing pseudospark switches and proved e-beams for applications such as FELs, pulsed lasers, X-ray machines, and radar. The improvement in e-beam quality is obtained by inductively ionizing gas inside the hollow cathode chamber (HCC), prior to main gap breakdown using a HCC that incorporates a spiral induction coil. The gas in the hollow cathode chamber is ionized by the discharge of an auxiliary capacitor bank through the spiral coil that forms the back surface of the HCC.

18 Claims, 6 Drawing Sheets

ADVANCED MULTIPURPOSE PSEUDOSPARK SWITCH HAVING A HOLLOW CATHODE WITH A PLANAR SPIRAL ELECTRODE AND AN APERTURE

STATEMENT REGARDING FEDERALLY SPONSORED RESEARCH OR DEVELOPMENT

The government may have certain rights.

CROSS-REFERENCE TO RELATED APPLICATIONS

Not Applicable

INCORPORATED-BY-REFERENCE OF MATERIAL SUBMITTED ON A COMPACT DISC

Not Applicable

BACKGROUND OF THE INVENTION

1. Field of the Invention

The present invention relates to pseudospark switches and their applications as electron beam sources for free electron lasers, high power magnetrons, and compact x-ray generators; high power switches for laser and microwave HV units, capacitor discharges, and crow bar protection; and materials processing applications such as cutting, drilling, and film deposition.

2. Description of Related Art

Pseudospark discharge e-beam generators and preionization-controlled open-ended hollow cathode (PCOHC) transient discharge e-beam sources are described in references 1-8 and U.S. Pat. Nos. 5,055,748; 5,126,638; 5,502,356; 5,850,125; and 6,104,022, incorporated by reference herein in their entirety.

Pseudospark switches operate on the left branch of the Paschen curve, close to vacuum breakdown. In these devices, the inter-electrode distance, d is comparable to or smaller than the electron mean free path for collision, $\lambda_{mfp}$ at the nominal operating pressure, $d \leq \lambda_{mfp}$. This configuration prevents avalanche ionization and breakdown. The anode and cathode apertures play a key role in the operation of the device by increasing the effective path for ionization and breakdown at lower voltages. When breakdown occurs, the discharge is confined on the axis of the device, and little or no erosion of the electrodes takes place. A classic pseudospark discharge starts with the ignition of the high voltage glow discharge along the axis of the device. During this period, high-energy ions are accelerated into the hollow cathode where they produce secondary electrons. These electrons are accelerated toward the cathode aperture by the potential difference and then are extracted toward the anode. The remaining low energy ions modify the potential distribution in the hollow cathode chamber (HCC) and retard the movement of the highly energetic ions from the main gap.

The accumulation of positive charge inside the HCC forms a virtual anode. Thus, the hollow cathode and the main chamber are separated by a potential barrier. The potential barrier will allow only sufficiently energized electrons to leave, decreasing the electron current. The subsequent growth of the anode plasma and the neutralization of the virtual anode will eventually allow the low energy electrons to escape the HCC and cause a steep rise in the e-beam current. The result of this two-step process is an e-beam with two current peaks (FIG. 1). The first peak (I) is relatively weak and is due to highly energetic electrons formed prior to gap breakdown. The second, larger peak (II) is due to less energetic (bulk) electrons formed during the collapse of the anode-cathode field. During its propagation, the low energy e-beam of the classic pseudospark is scattering and degrading due to frequent electron-neutral particle collisions.

Electron beam quality is measured by two related quantities: beam emittance and beam brightness. The emittance refers to the collimation of the beam and is defined as the product between the beam radius and the angle of the velocity vector with the symmetry axis. Beam brightness is directly proportional to beam current and inversely proportional to the square of the emittance, and measures beam intensity and beam collimation. Electron-beams produced by existing pseudospark switches, in qualitative terms, have wider energy distributions (lower brightness) and higher divergence (higher emittance) that desired for some applications. For example, the use of pseudospark discharge e-beam generators for free electron lasers (FELs) has been prevented by the axial velocity-spread of the beam. Typically the maximum energy spread for either the high-gain Compton or collective Raman regimes must be less than 1% of total beam energy for efficient transfer of electron energy to electromagnetic waves. FIG. 1 shows an exemplary expected e-beam current produced by the present invention (AMPS).

BRIEF SUMMARY OF THE INVENTION

The advanced multipurpose pseudospark switch (AMPS) of the present invention provides higher electron beam brightness, lower beam emittance, and higher average electron energy that existing e-beam generators. The improvement in e-beam quality over a classic pseudospark or PCOHC is obtained by strong ionization of the gas inside the hollow cathode chamber (HCC), prior to main gap breakdown. Specifically, the low-pressure gas in the hollow cathode chamber is ionized by the discharge of an auxiliary capacitor bank through a spiral coil that forms the back surface of the hollow cathode chamber.

DETAILED DESCRIPTION OF THE INVENTION

The AMPS e-beam generator comprises an inverted-cup/hollow cathode configuration, with an operational mode similar to preionization-controlled open-ended hollow cathode transient discharges PCOHC. The gas inside the hollow cathode chamber is ionized prior to main gap breakdown by the discharge of an auxiliary capacitor bank through a spiral coil that forms the back surface of the hollow cathode chamber.

Figure 1:
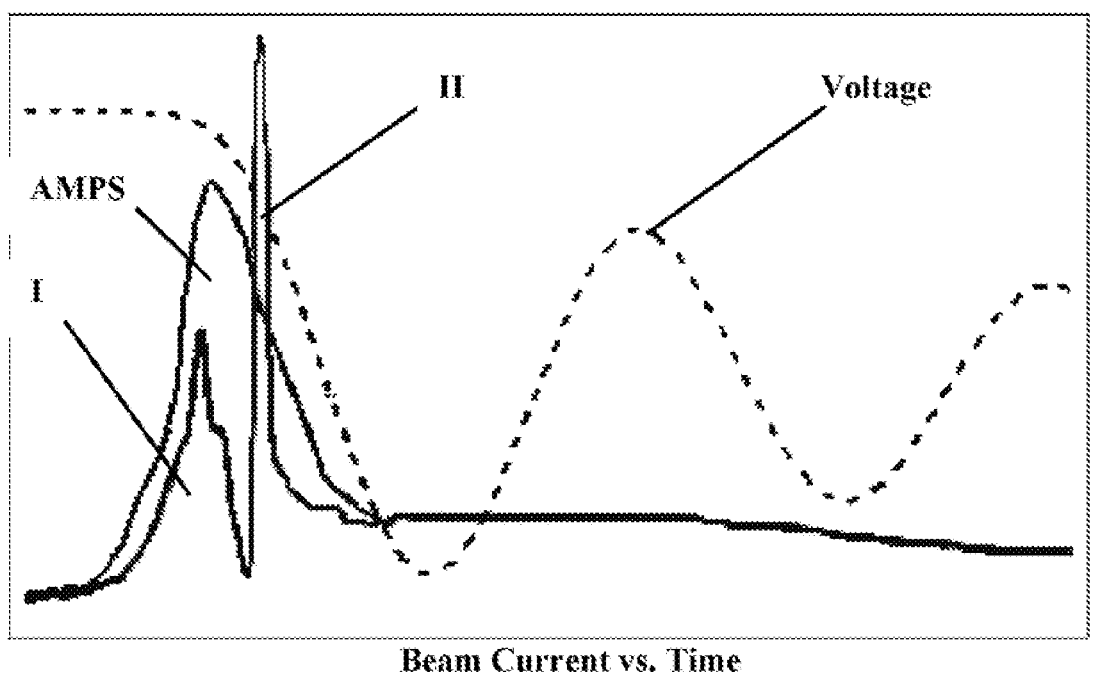
FIG. 1 is a graph contrasting e-beam current traces of a classic pseudospark switch and a pseudospark switch according to the present invention.

Electrons are initially created and energized in a hollow cathode by an electric field, which is induced when the spiral shaped base of the hollow cathode is energized before electrons traverse the main gap. A potential is applied selectively to base of the cathode, located opposite the aperture, which induces an electric field that ionizes gas in the cavity of the hollow cathode. Electrons in the cavity of the hollow electrode are already energized at the time of main gap breakdown and a large number of these electrons leave the cathode aperture region "en masse" generating a large current peak. At the time of electron emission, the main gap field has not yet collapsed and the electrons are further energized as they traverse the cathode-anode distance. These electrons act as a trigger for the main discharge. Overall, the kinetic energy of the electrons is higher by the amount provided during preionization. The higher energy levels (10-100 keV) achieve by these electrons make them less likely to collide with neutral atoms in their path, and the resulting e-beam at the anode has a high intensity, a low energy spread, and low divergence. The expected e-beam currents generated by one AMPS embodiment are contrasted with those generated by a classic pseudospark in FIG. 1. Unlike the classic pseudospark AMPS produces a single peak e-beam current. Reducing or eliminating the emission of lower energy electrons reduces the heat transferred to the device because low energy electrons will either lose their energy by colliding with gas particles, or be neutralized at the anode. Consequently, the present pseudospark switch experiences a smaller thermal load than existing pseudospark switches at the same nominal power. In other words, it transfers a larger fraction of input energy to the e-beam. Higher efficiency and reduced thermal loads allow reductions in pseudospark switch size for the same nominal power. The following descriptions of several embodiments of the invention are provided to explain the invention and not to limit the scope of the invention to the embodiments used.

Figure 2:
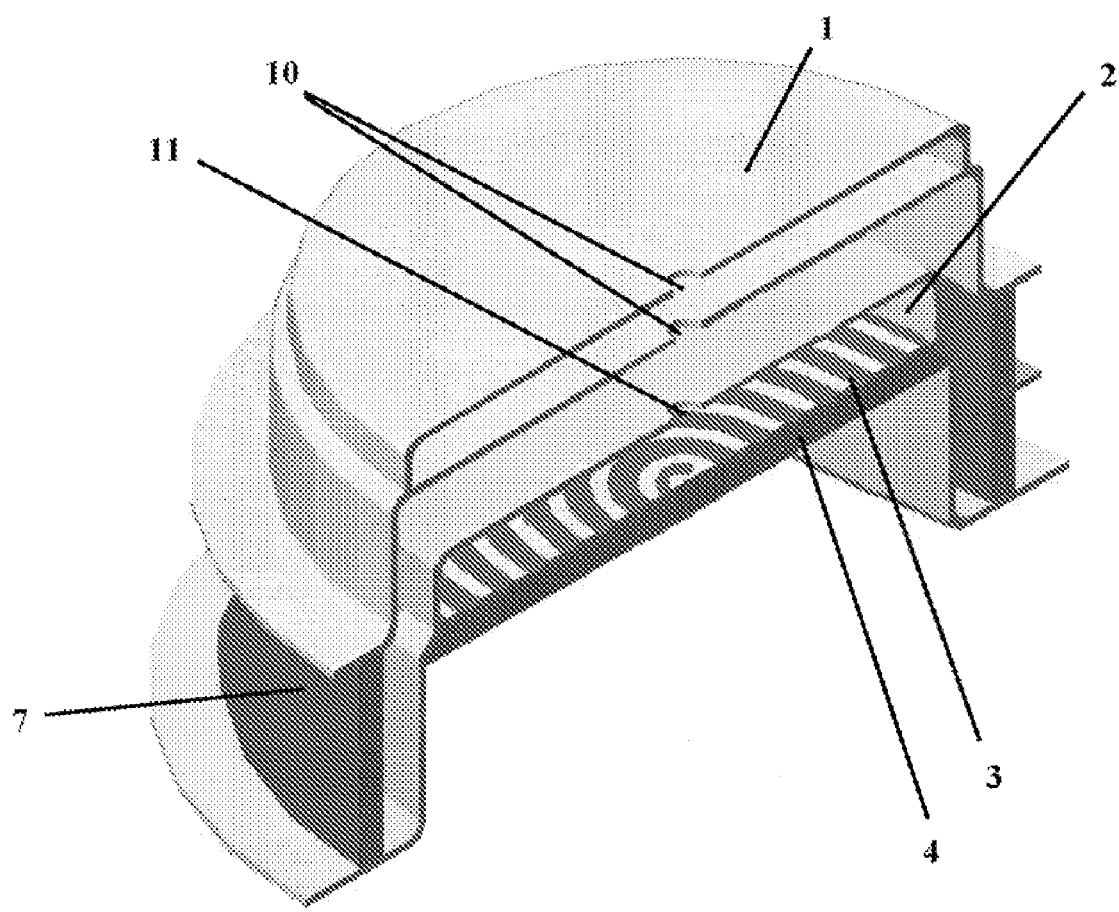
FIG. 2 shows a cut-away diagram of a pseudospark switch according to the present invention for electron beam generation.
Figure 3:
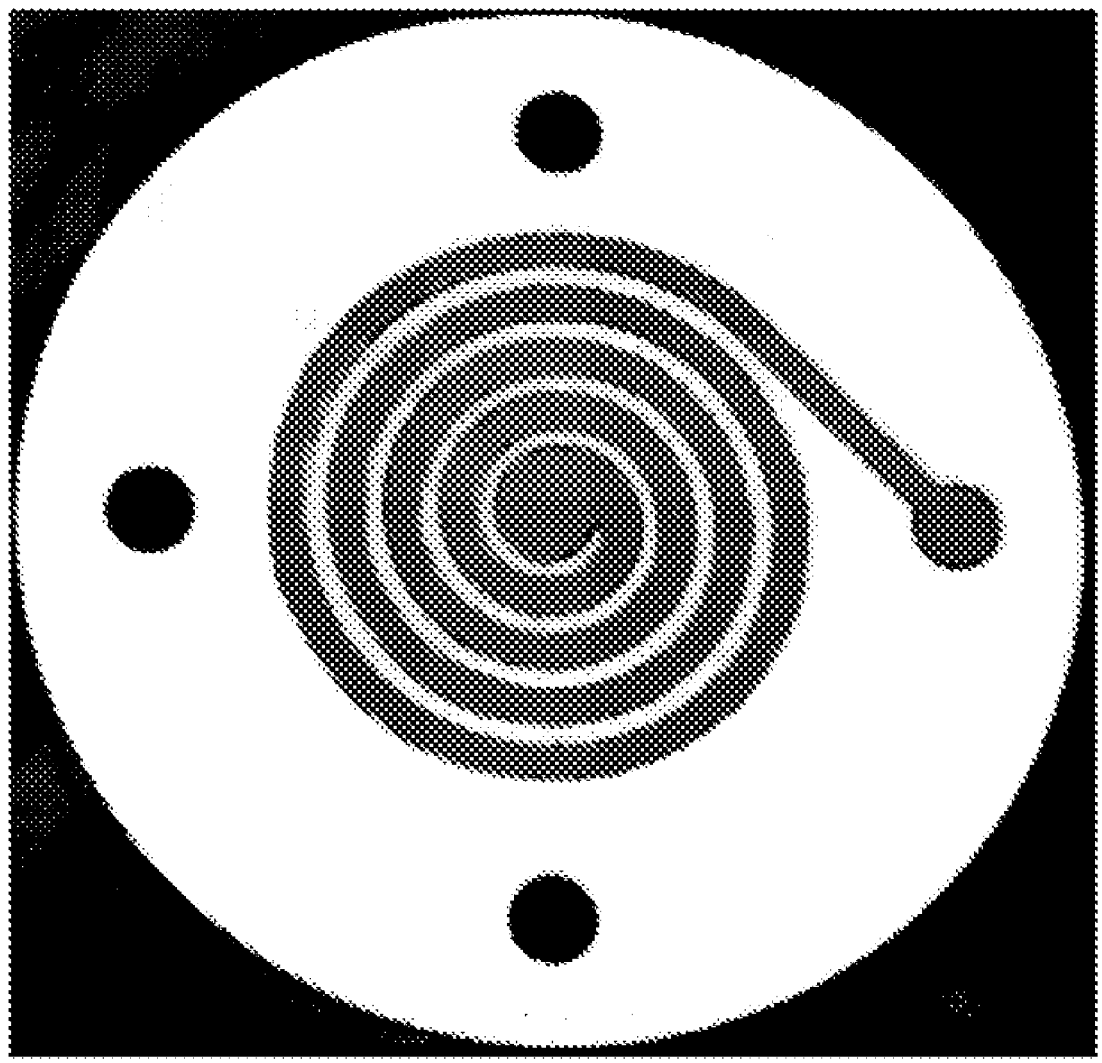
FIG. 3 shows an example of the induction coil ring portion of a hollow cathode according to the present invention.

FIG. 2 shows a cutaway view of one embodiment of an AMPS. In this embodiment, hollow anode 1 and hollow cathode 2 are separated by an insulating ceramic body 7. The base of the hollow cathode 2 opposite the cathode aperture 11 comprises an induction coil 3 formed on a supporting ceramic base 4. Apertures in the hollow anode 10, aligned with an aperture in the hollow cathode allows the electron beam to exit the AMPS. The anode may be a hollow anode, a plate anode, or other type of anode with or without an aperture, depending on the application. The AMPS shown in FIG. 2 is intended for use as an e-beam source and therefore includes apertures to allow electrons to pass through the anode. FIG. 3 is an image of a coil electrode manufactured on a ceramic support that forms the base of a hollow cathode used to demonstrate the present invention.

Figure 4:
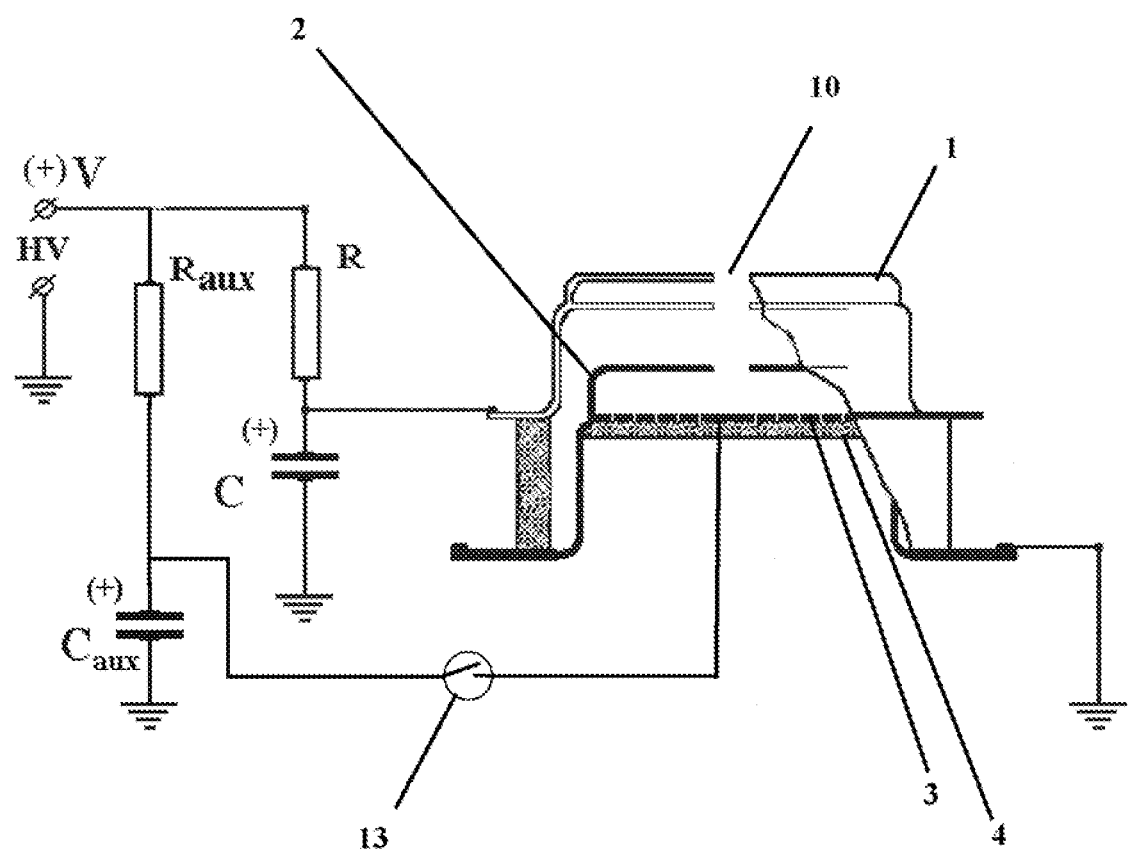
FIG. 4 shows a wiring diagram combined with a side, cut away view for one embodiment of the AMPS.

FIG. 4 is a wiring diagram for the AMPS embodiment shown in FIG. 2. The system comprises a main circuit and an auxiliary circuit. A potential is applied to induction coil 3 in hollow cathode 2 from $C_{aux}$ in the auxiliary circuit, which is controlled by switch 13. A potential is applied to the main gap through capacitor C, which is controlled by the distance between anode 1 and cathode 2. Closing switch 13 causes current to flow through induction coil 3, which ionizes a gas inside hollow cathode 2. Electrons from the ionized gas inside the hollow cathode move toward anode 1, which is positively charged. Movement of the electrons toward anode 1 triggers main gap breakdown and electrons from the cathode 2 join electrons from the ionized gas in traversing the main gap separating cathode and anode. The main and auxiliary circuits may be powered by the same power supply through charging resistors R and $R_{aux}$ as shown or by separate power supplies. C is the main capacitor bank and $C_{aux}$ is the auxiliary capacitor bank.

Figure 5:
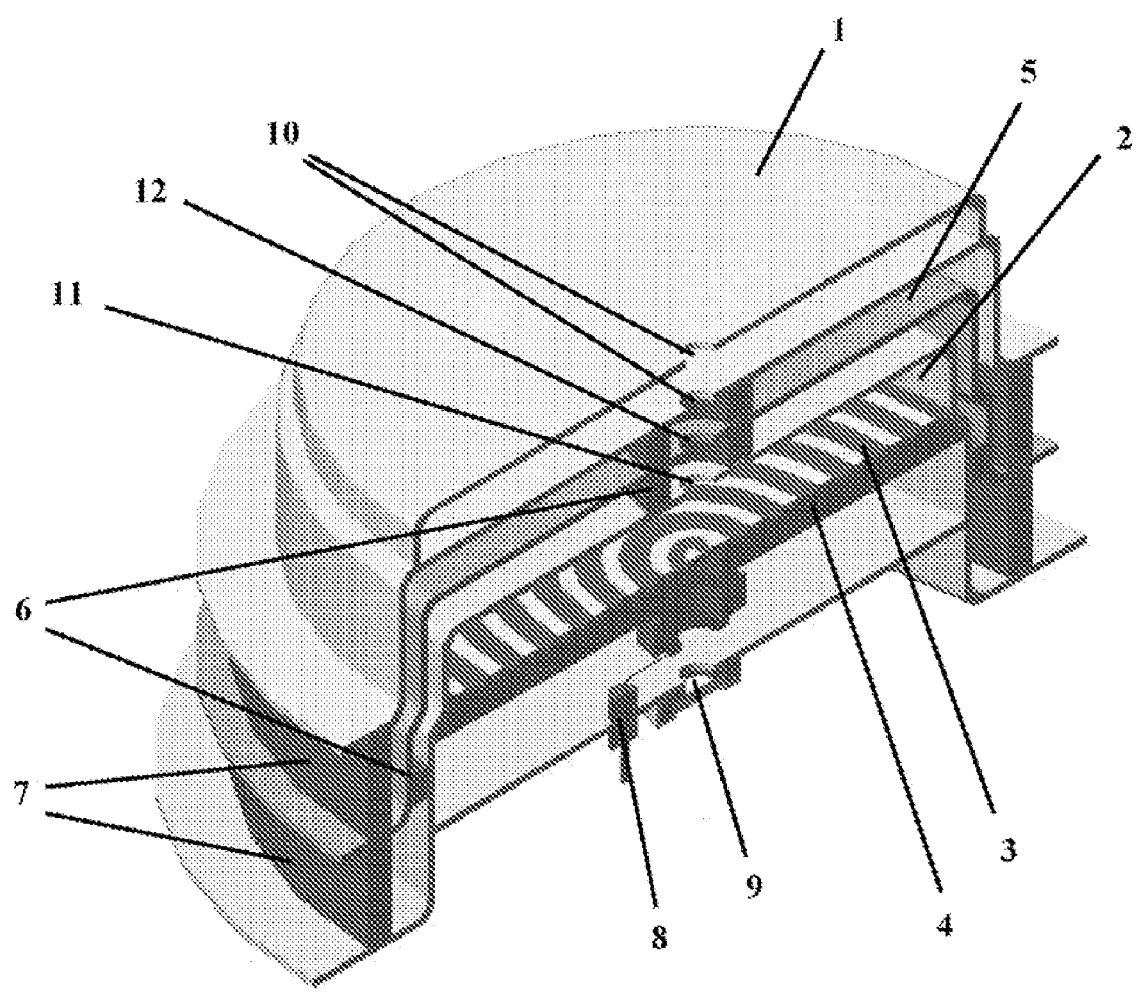
FIG. 5 shows a cut-away diagram of a pseudospark switch according to the present invention including one or more triggers and one or more intermediary electrodes for shaping the electron beam.

FIG. 5 shows an embodiment of the AMPS comprising a laser trigger and specialized for use as an e-beam source. In this embodiment, hollow anode 1 and hollow cathode 2 are separated by ceramic insulators 6 and a supporting ceramic body 7. The back surface of the hollow cathode 2 comprises a spiral electrode 3 formed on a supporting ceramic base 4. An intermediary electrode 5 is located between, and is electrically insulated from, hollow anode 1 and hollow cathode 2. Intermediary electrode 5 is used to shape the electron beam emitted during discharge, which may be triggered by a laser entering through window 9. In this embodiment, the center spiral electrode 3 is in electrical contact with a conducting target plate (not shown) located at the base of ceramic support 4. A laser beam entering through window 9 generates electrons that complete the auxiliary circuit featuring a secondary anode 8. Completion of this circuit energizes spiral electrode 3. Apertures 10 in hollow cathode 1, aligned with an aperture 12 in intermediary electrode 5 and an aperture 11 in hollow cathode 2 allows the electron beam to exit the AMPS.

Figure 6:
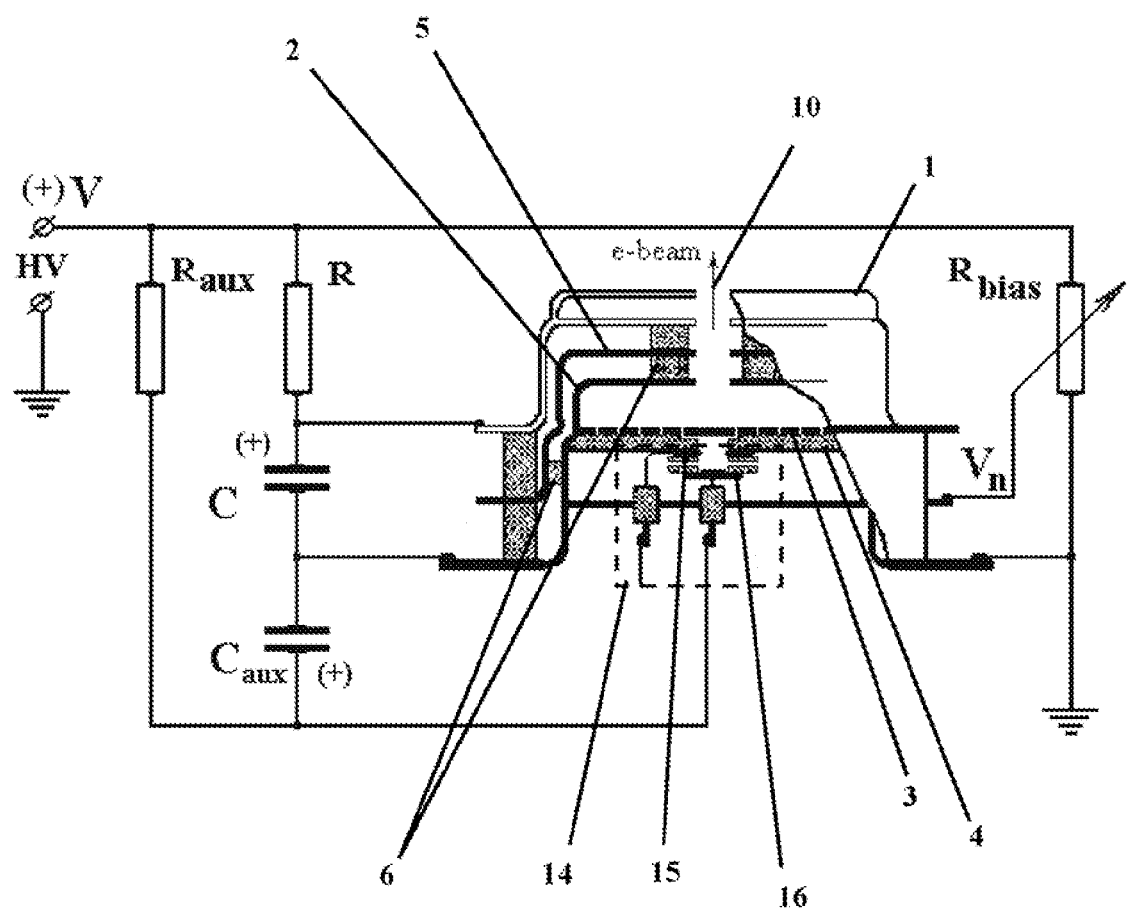
FIG. 6 is shows a wiring diagram combined with a side, cut away view for one embodiment of the AMPS comprising a high voltage trigger and an intermediary electrode.

FIG. 6 shows a wiring diagram combined with a side, cut away view for an AMPS embodiment comprising a high voltage trigger and designed as an electron beam source. The system comprises three circuits, a main gap circuit, and auxiliary circuit, and a bias circuit. The auxiliary circuit is triggered by a high voltage trigger 14 comprising auxiliary anode 15 on ceramic base 4 supporting induction coil 3 separated by a gap from auxiliary cathode 16. A potential is applied to the main circuit through resistor R, which is controlled by the main gap between hollow anode 1 and hollow cathode 2. Activation of high voltage trigger 14 activates spiral electrode 3, which, in turn, generates free electrons in hollow cathode 2 that lead to main gap breakdown. The movement of electrons toward anode 1 is modified by intermediate electrode 5. Resistor $R_{bias}$ is used to control the voltage Vn applied to intermediate electrode 5, which alters the shape of the electric field through the main gap. C is the main capacitor bank and $C_{aux}$ is the auxiliary capacitor bank.

Generally, experiments and simulations have shown that the amount of energy transferred into the ionized gas (plasma) inside the hollow cathode is dependent on the discharge time, capacitor bank size and coil inductance. A large coil inductance better couples to the plasma, increases the discharge characteristic time, and decrease the preionization current. Similarly, a larger capacitor bank increases the total amount of available energy and decreases the discharge power due to a longer discharge time.

Operational parameters for electron beam sources vary dependent upon the application. For example, an AMPS embodiment used as an electron beam source for a free electron laser may produce a current of between 50 and 200 Amps, a current density of between 1 and 10 kA/cm$^2$, a brightness of $10^{10}$-$10^{12}$ A·m$^{-2}$·rad$^{-2}$, an emittance of between 5 and 60 mm·mrad, and electrons with an energy of between 0.02 and 0.15 MeV.

As an example, one AMPS embodiment comprises a cathode coil with an inductance of 0.5-3 µH, a cathode diameter of 40-60 mm, a cathode height of 20-50 mm, and an auxiliary capacitor bank of 1-3 nF.

Although particular embodiments of the present invention have been described, it is not intended that such references be construed as limitations upon the scope of this invention except as set forth in the claims.

REFERENCES

[1] Frank, K., Dewald, E., Bickes, C., Ernst, U., Iberler, M., Meier, J., Prucker, U., Rainer, A., Schlaug, M., Schwab, J., Weisser, W., and Hoffman, D., *Scientific and Technological Progress of Pseudospark Devices*, IEEE Trans. on Plasma Science, Vol. 27, No. 4, pp. 1008-1020, 1999.

[2] Dewald, E., Ganciu, M., Mandache, B., Musa, G., Nistor, M., Pointu, A., Popescu, I., Frank, K., Hoffmann, D., and Stark, R., *The role of Multielectrode Geometry in the Generation of pulsed Intense Electron Beams in Preionization-Controlled Open-Ended Hollow-Cathode Transient Discharges*, IEEE Trans. on Plasma Science, Vol. 25, No. 2, pp. 279-283, 1997.

[3] Gastel, M., Hillman, H., Müller, F., Westheide, J., *Influence of the Hollow Cathode Dimensions on the Electron Beam Current in a Pseudospark Discharge*, IEEE Trans. on Plasma Sci., Vol. 23, No. 3, pp. 248-253, 1995.

[4] Bloess, D., Kamber, I., Riege, H., et. al., *The triggered Pseudo-Spark Chamber as a Fast Switch and as a High-Intensity Beam Source*, Nuclear Instruments and Methods, 205, pp. 173-184, 1983.

[5] Taguchi, H., et. al., *Effects of Electrode Geometry on Breakdown Voltage of a Single Gap Pseudospark Discharge*, Jpn. J. Appl. Phys., Vol. 37, pp. 303-307, 1998.

[6] Boeuf, J. P., and Pitchford, L. C., *Pseudospark Discharges Via Computer Simulation*, IEEE Transactions on Plasma Science, Vol. 19, No. 2, April 1991.

[7] Pitchford, L. C., *Electron-Beam Generation During the Hollow Cathode Phase of Pseudospark Discharges*, J. Appl. Phys. Vol. 75, No. 11, pp. 7227-7230, 1994.

[8] Choi, P., Chuaqui, H., Favre, M., and Colas, V., *Breakdown Formation in a Transient Hollow Cathode Discharge-A Statistical Study*, IEEE Trans. on Plasma Sci., Vol. 23, No. 3, pp. 221-228, June 1995.

What is claimed is:

1. A multipurpose pseudospark switch comprising:
a hollow cathode comprising a base and an aperture opposite the base, wherein the base of the hollow cathode comprises a planar, spiral electrode on a non-conducting support material;
an anode electrically insulated from the hollow cathode, located opposite the aperture of the hollow cathode and separated a gap distance there from;
means for selectively applying a potential between the hollow cathode and the anode, and selectively applying a potential to the planar spiral electrode; and
a sealed housing enclosing the hollow cathode, anode, and a gas.

2. The pseudospark switch of claim 1 further comprising a gas inlet port vacuum pump connecting port in the sealed housing.

3. The pseudospark switch of claim 1 wherein the gas is an inert, elemental gas.

4. The pseudospark switch of claim 1, wherein the anode has a disc shape and comprises a central aperture.

5. The pseudospark switch of claim 1, wherein the spiral electrode is made from a molybdenum alloy coated with copper.

6. The pseudospark switch of claim 1, wherein the spiral electrode is formed on a ceramic material.

7. The pseudospark switch of claim 1, wherein the electrical insulator comprises a ceramic material.

8. The pseudospark switch of claim 1 further comprising an intermediary electrode located between and insulated from the hollow cathode and anode and having an aperture allowing electrons to pass from the hollow cathode to the anode.

9. The pseudospark switch of claim 1 further comprising a trigger in electrical communication with the spiral electrode.

10. A pseudospark electron beam generator comprising:
a) a hollow cathode comprising a base and an aperture opposite the base, wherein the base of the hollow cathode comprises a planar, spiral electrode on a non-conducting support material;
b) a hollow anode having a pair of opposing apertures that is electrically insulated from the hollow cathode, separated from the hollow cathode by a gap distance, wherein the apertures of the hollow anode are in alignment with the aperture of the hollow cathode;
c) an intermediary electrode located between and electrically insulated from the hollow cathode and hollow cathode, the intermediary electrode having an aperture in alignment with the apertures of the hollow cathode and hollow anode;
d) means for selectively applying a potential between the hollow cathode and the anode, and selectively applying a potential to the planar spiral electrode and intermediary electrode and
e) a sealed housing enclosing all elements/components of a-c.

11. A method for generating a pseudospark discharge comprising:
A sealed chamber enclosing a hollow cathode, an anode, and a gas wherein:
the hollow cathode comprises a base and an aperture on opposing sides, wherein the base of the hollow cathode comprises a planar, spiral electrode on a non-conducting support material;
the anode is electrically insulated from the hollow cathode, is located opposite the aperture of the hollow cathode and is separated by a gap distance there from;
selectively applying a potential to the planar spiral electrode to ionize gas within the hollow cathode and
selectively applying a potential between the hollow cathode and the anode;
wherein a pseudospark discharge is initiated between the hollow cathode and anode by ionized gas formed within the hollow cathode.

12. The method of claim 11 wherein selectively applying a potential to the planar spiral electrode to ionize gas within the hollow cathode is accomplishes through the use of a high voltage trigger or a laser trigger.

13. The method of claim 11 wherein the anode is a hollow anode comprising opposed apertures in alignment with the aperture of the hollow cathode.

14. The method of claim 13 further comprising an intermediary electrode located between and insulated from the hollow cathode and anode and having an aperture allowing electrons to pass from the hollow cathode to the anode.

15. The method of claim 11 further comprising an intermediary electrode located between and insulated from the hollow cathode and anode and having an aperture allowing electrons to pass from the hollow cathode to the anode.

16. The method of claim 11 wherein the pseudospark discharge is used as an electron beam source.

17. The method of claim 11 wherein the spiral electrode has an inductance of 0.5-3 µH, the hollow cathode has diameter of 40-60 mm, the distance between the spiral electrode, and the aperture in the hollow cathode is 20-50 mm.

18. The method of claim 11 wherein the pseudospark discharge produces a current of 50-200 A, a current density of 1-10 kA/cm$^2$, a brightness of $10^{10}$-$10^{12}$ A·m$^{-2}$·rad$^{-2}$, an emittance of 5-60 mm·mrad, and electrons having an energy of 0.02-0.15 MeV.

* * * * *